(12) United States Patent
Loopstra et al.

(10) Patent No.: US 7,230,676 B1
(45) Date of Patent: *Jun. 12, 2007

(54) LITHOGRAPHIC APPARATUS AND DEVICE MANUFACTURING METHOD

(75) Inventors: Erik Roelof Loopstra, Heeze (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/373,529

(22) Filed: Mar. 13, 2006

(51) Int. Cl.
*G03B 27/42* (2006.01)
*G03B 27/52* (2006.01)
*G03B 27/58* (2006.01)

(52) U.S. Cl. .............................. 355/53; 355/30; 355/72

(58) Field of Classification Search ................ 355/52, 355/53, 55, 67–72; 356/399–401; 250/548
See application file for complete search history.

(56) References Cited

U.S. PATENT DOCUMENTS

| | | |
|---|---|---|
| 6,785,005 B2 | 8/2004 | Inoue |
| 6,788,393 B2 * | 9/2004 | Inoue ........................ 355/72 |
| 6,879,382 B2 * | 4/2005 | Akutsu et al. ................ 355/67 |

FOREIGN PATENT DOCUMENTS

EP     1 510 870 A1    3/2005

OTHER PUBLICATIONS

Schäffel et al., "Integrated Electrodynamic Multicoordinate Drives—Modern Components for Intelligent Motions", Proceedings of: The Eleventh Annual Meeting—The American Society for Precision Engineering, vol. 14, pp. 456-461 (Nov. 9-14, 1996).

* cited by examiner

*Primary Examiner*—Henry Hung Nguyen
(74) *Attorney, Agent, or Firm*—Pillsbury Winthrop Shaw Pittman, LLP (57) ABSTRACT

A lithographic apparatus includes a liquid confinement system to confine liquid in a space between a final element of a projection system and a substrate, and a first and a second substrate stage that are configured to mutually cooperate in order to perform a joint movement for bringing the lithographic apparatus from a first configuration, in which the liquid is confined between a first substrate held by the first substrate stage and the final element, towards a second configuration, in which the liquid is confined between a second substrate held by the second substrate stage and the final element, such that during the joint movement the liquid is essentially confined within the space with respect to the final element. The apparatus also includes a position measurement system configured to at least during the joint movement measure the position of the first and second substrate stages.

13 Claims, 4 Drawing Sheets

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

One of the most challenging requirements for microlithography for the production of integrated circuits as well as liquid crystal display panels is the positioning of stages. For example, sub-100 nm lithography demands substrate- and mask-positioning stages with dynamic accuracy and matching between machines to the order of 1 nm in all 6 degrees of freedom (DOF).

A popular approach to such demanding positioning requirements is to sub-divide the stage positioning architecture into a coarse positioning module (e.g. an X-Y table or a gantry table) with micrometer accuracies but travelling over the entire working range, onto which is cascaded a fine positioning module. The latter is responsible for correcting for the residual error of the coarse positioning module to the last few nanometers, but only needs to accommodate a very limited range of travel. Commonly used actuators for such nano-positioning include piezoelectric actuators or voice-coil type electromagnetic actuators. While positioning in the fine module is usually effected in all 6 DOF, large-range motions are rarely required for more than 2 DOF, thus easing the design of the coarse module considerably.

The micrometer accuracy desired for the coarse positioning can be readily achieved using relatively simple position sensors, such as optical or magnetic incremental encoders. These can be single-axis devices with measurement in one DOF, or more recently multiple (up to 3) DOF devices such as those described by Schäffel et al "Integrated electrodynamic multicoordinate drives", Proc. ASPE Annual Meeting, California, USA, 1996, p. 456–461. Similar encoders are also available commercially, e.g. position measurement system Type PP281R manufactured by Dr. J. Heidenhain GmbH. Although such sensors can provide sub-micrometer level resolution without difficulty, absolute accuracy and in particular thermal stability over long travel ranges are not readily achievable.

Position measurement for the mask and substrate stages at the end of the fine positioning module, on the other hand, has to be performed in all 6 DOF to sub-nanometer resolution, with nanometer accuracy and stability. This is commonly achieved using multi-axis interferometers to measure displacements in all 6 DOF, with redundant axes for additional calibration functions (e.g. calibrations of interferometer mirror flatness on the substrate stage).

With the above approach, every time the stage is brought (back) into the range of the fine positioning module, the position of the stage has to be (re)calibrated in six degrees of freedom. This may take a considerable amount of time, and as a result the throughput of the lithographic apparatus may be decreased.

Furthermore, with the above approach, in the case of a lithographic apparatus including two substrate stages, one of the substrate stages can eclipse the substrate stage for a signal of one of the interferometers; the first substrate stage can be located between the interferometer and the second substrate stage.

U.S. Pat. No. 6,785,005 (herein incorporated by reference) discloses such position measurement system having two substrate stages. In this system the eclipse problem as indicated above is solved by providing the substrate stage which is located the furthest from the interferometer, with a mirror surface which is larger than the first substrate stage, so that in every position of the first substrate stage a signal of one of the interferometers can be directed on the mirror surface of the second substrate stage. However, this solution is unsatisfactory since the substrate stage have different sizes. Furthermore, the solution makes a complex switching between the interferometers necessary when the first substrate stage moves before the second substrate stage.

U.S. Pat. No. 6,879,382 (herein incorporated by reference) discloses another position measurement system for continuously measuring the position of two substrate stages of a lithographic apparatus. The position measurement system includes interferometers to determine the position of both substrate stages. Although the position measurement system of U.S. Pat. No. 6,879,382 makes determination of the position of the two substrate stages in the x-y plane possible, it does not offer the flexibility which is desired to make an immersion head take-over possible as described in the co-pending application having U.S. application Ser. No. 11/135,655 the contents of which is herein incorporated by reference.

SUMMARY

It is desirable to provide a lithographic apparatus including a first and a second substrate stage and a position measurement system for determining the position of the first and second substrate stage.

According to an embodiment of the invention, there is provided a lithographic apparatus including: a patterning device support constructed to support a patterning device, the patterning device being capable of imparting a radiation beam with a pattern in its cross-section to form a patterned radiation beam; a projection system configured to project the patterned radiation beam onto a substrate in an exposure station of the apparatus; a liquid confinement system for confining liquid between a final element of the projection system and the substrate; a first and a second substrate stage constructed to hold substrates, and a position measurement system for measuring the position of the first and the second substrate stage, wherein the first and second substrate stages are constructed and arranged for mutual cooperation in order to perform a joint movement for bringing the lithographic apparatus from a first situation, wherein the liquid is confined between a first substrate held by the first substrate stage and the final element, towards a second situation, wherein the liquid is confined between a second substrate held by the second substrate stage and the final element, such that during the joint movement the liquid is essentially confined within the space with respect to the final element, and wherein the interferometer position measurement system is configured to continuously measure the position of the first substrate stage and the second substrate stage.

According to an embodiment of the invention, there is provided a device manufacturing method including projecting a patterned beam of radiation onto a substrate in a dual stage lithographic apparatus including a first and a second substrate stage for holding a substrate and a liquid confinement system for confining liquid between a final element of a projection system and the substrate, wherein the first and second substrate stages mutually cooperate in order to perform a joint movement for bringing the lithographic apparatus from a first situation, wherein the liquid is confined between a first substrate held by the first substrate stage and the final element, towards a second situation, wherein the liquid is confined between a second substrate held by the second substrate stage and the final element, such that during the joint movement the liquid is essentially confined within the space with respect to the final element, and wherein an interferometer position measurement system measures continuously the position of the first substrate stage and the second substrate stage.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
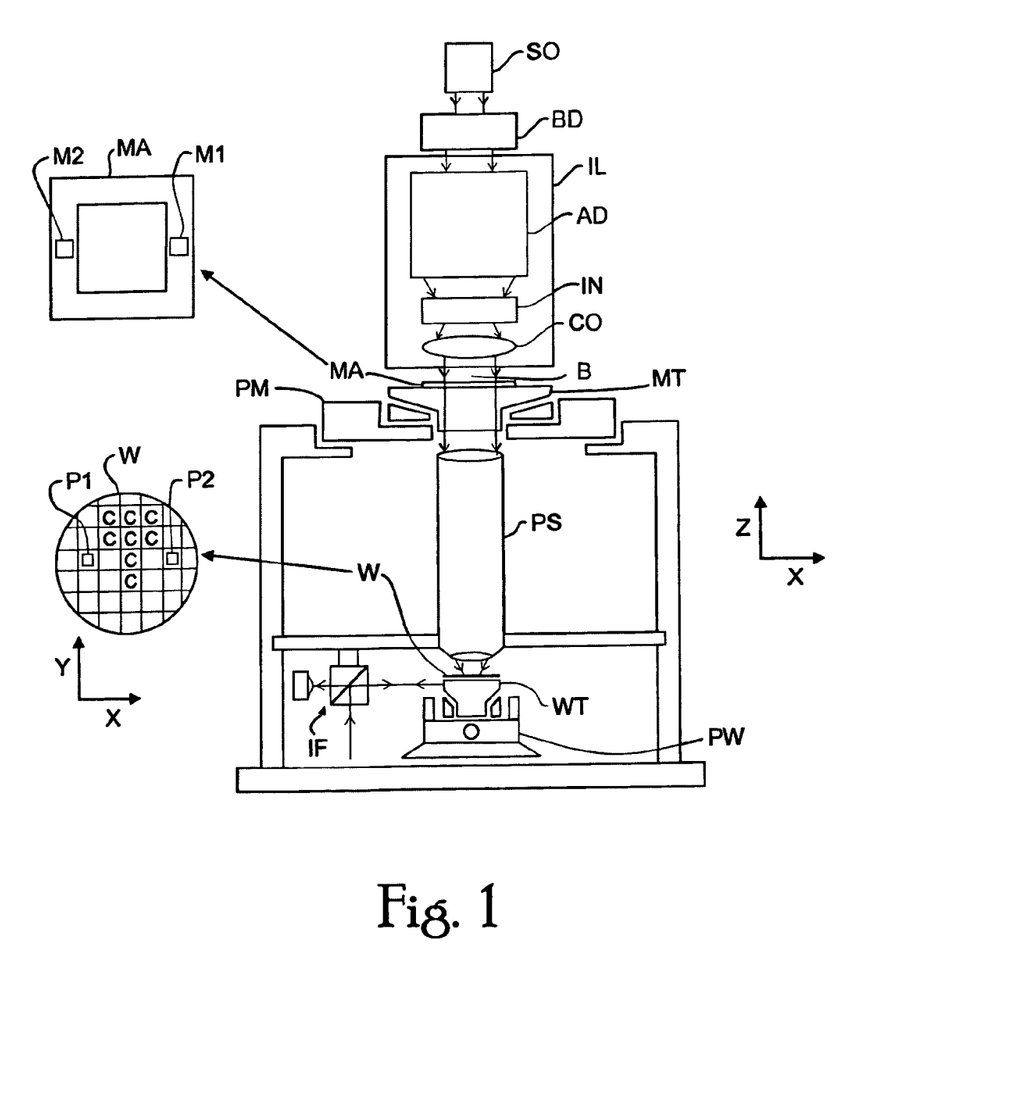
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
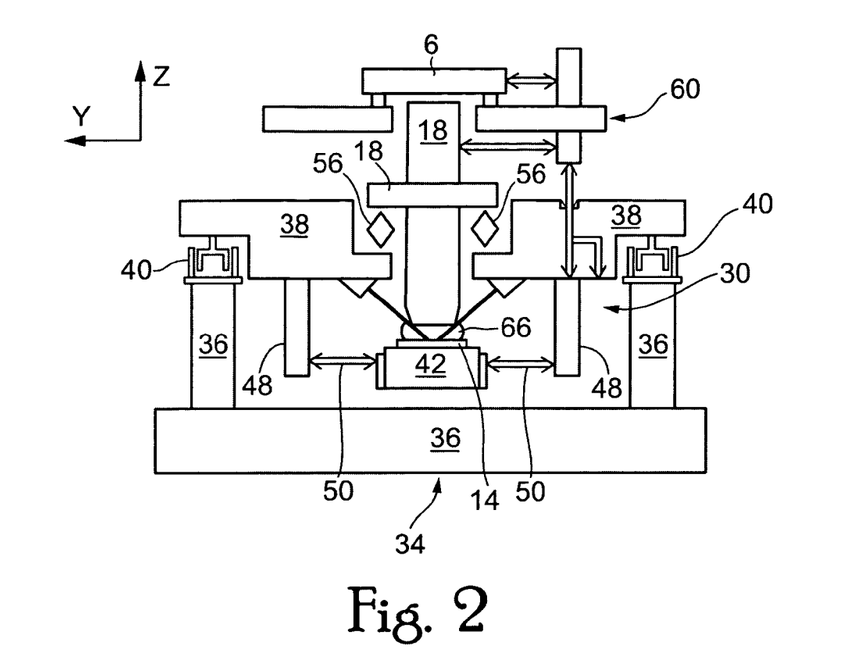
FIG. 2 depicts an exposure station of a lithographic apparatus according to an embodiment of the invention.

FIG. 2 is a schematic side view of an exposure station 34. The exposure station 34 is supported by the base frame 36. The base frame carries a metro frame 38. The metro frame 38 is dynamically isolated from the base frame 36 by an isolation device 40. A projection system 18 is supported by the metro frame 38 via supporting members 56 (the supporting members 56 may also be a dynamical isolation device). A position sensor 30 configured to measure the position of a stage 42, is mounted on the metro frame 38. However, it is noted that the position sensor 30 may also be carried by the projection system 18 (or, equivalently, by a frame attached to the projection system 18).

A reticle stage or mask stage 6 is located above the projection system 18. The position of the reticle stage and the position of the mask/reticle are measured by a measuring system 60. The measuring system 60 cooperates with the position sensor 30 in order to align the mask/reticle with the substrate 14 under the projection system 18. Aligning the mask/reticle to the substrate is usually performed according to zero point sensors and TIS-alignment techniques (see for a description EP 1510870, the contents of which is herein incorporated by reference). For applying the TIS-alignment, the position of the substrate with respect to the metro frame 38 is known within a certain accuracy (rough indication as starting point for the fine TIS measurements) such that the substrate is in the capture range of the TIS sensor.

In the lithographic apparatus according to the embodiment of the invention, there is provided an immersion liquid 66 between a final optical (lens) element of the projection system 18 and a target portion of the substrate 14. The application of immersion fluid yields the benefit that during exposure smaller structures of patterns can be transferred from the reticle or mask to substrates 14 than in a comparable system without immersion fluid. The lithographic apparatus has a liquid confinement system adapted to confine liquid between a final element of the projection system and the substrate. The liquid confinement system includes a so-called immersion hood 68 (See FIG. 3). The immersion fluid may be kept in place during illumination by the immersion hood 68. The immersion hood 68 may include a mechanical contact-seal and/or may also include a contact-less seal which operation is based on guiding a pressure-gas-flow towards the fluid to be confined (combinations are possible).

After exposure of a substrate, the stage holding moves away, for example towards a metrology station. Since it is desired that the immersion fluid 66 is kept in its space under the final element of the projection system 18, special measures have to be taken before the stage can be moved away from its position under the space of the immersion liquid 66. A possibility is to use a separate closing disc or a separate small closing stage (unable to hold a substrate) which closes the space at the bottom, until a stage holding a substrate to be exposed takes the place of the closing disc/closing stage.

However, the closing disc/closing stage yields extra take-over operations which cost valuable time and which appear to decrease the throughput of the lithographic apparatus significantly.

Therefore, in an embodiment of the invention, a closing disc (or closing stage) is omitted and a lithographic apparatus is provided with stages that are constructed and arranged for mutual cooperation in order to perform a joint scan movement for bringing the lithographic apparatus from a first situation, wherein the liquid is confined between a first substrate held by the first stage of the stages and the final element, towards a second situation, wherein the liquid is confined between a second substrate held by the second stage of the two stages and the final element, such that during the joint scan movement the liquid is essentially confined within the space with respect to the final element. For instance, such lithographic apparatus has been described in the co-pending patent application having U.S. application Ser. No. 11/135,655, the contents of which is herein incorporated by reference. In this application the joint scan movement is also described as "immersion head take-over", which term is also used correspondingly in the present application.

Figure 3:
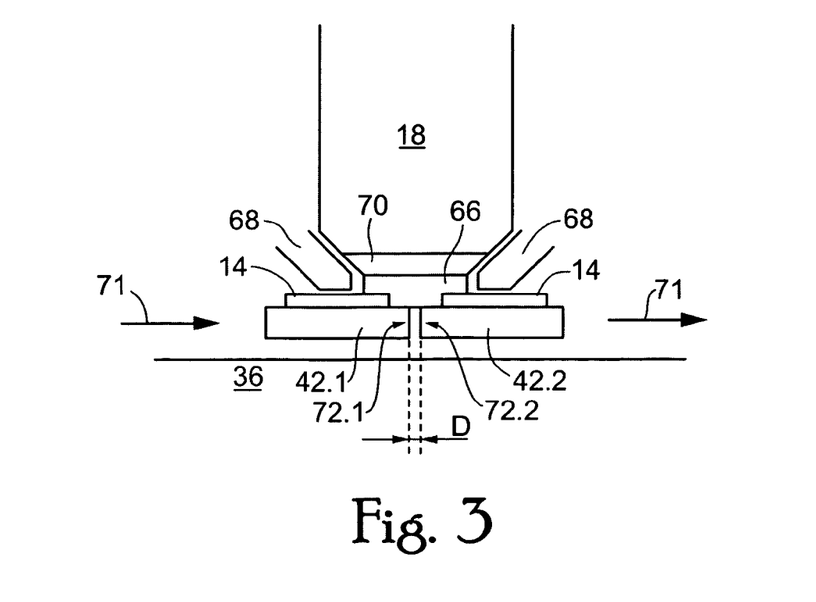
FIG. 3 depicts an immersion head take-over in the lithographic apparatus of FIG. 2.

The joint scan movement of the stages 42.1 and 42.2 is illustrated schematically in FIG. 3 (the arrows 71 indicate the direction of movement of the stages with respect to the projection system 18). The joint scan movement is performed such that the liquid 66 stays confined in its space under the final lens element 70. At the bottom of the space the stages 42.1, 42.2 confine the liquid 66. At the sides it is the immersion hood (which preferably stays in an essentially fixed position with respect to the projection system 18) which confines the liquid 66.

In an embodiment of the invention, the respective first stage 42.1 and second stage 42.2 have respective immersion cross edges 72.1, 72.2 (situated at or near a side of the relevant stage, see FIG. 3), wherein the immersion cross edges are constructed and arranged to cooperate with each other during the joint scan movement. Preferably, each immersion cross edge 72 includes one or more essentially plane and smooth surface(s). Thus, it is possible to perform the joint scan movement in such a way that a well-defined space is obtained between plane surfaces of different immersion cross edges (for example a space defined by parallel surfaces). In FIG. 3, an example is provided wherein the cooperating immersion cross edges of the stages define a space with a mutual distance D during the joint scan movement.

The lithographic apparatus according to an embodiment of the invention may include a control system (using a feedback and/or a feedforward loop) that may be fed with position measurements (actually the term position measurement may include position, velocity, acceleration and/or jerk measurements) of the stages for calculating setpoint-signals for the relevant motors. The motors are controlled during the joint scan movement of the stages by the positioning system according to the setpoint-signals such that the mutual constant distance D between the planes of the respective immersion cross edges corresponds to a pre-determined function. The pre-determined function may be chosen such that the space between the immersion cross edges functions a liquid channel character.

According to an embodiment of the lithographic apparatus, the positioning system is constructed and arranged to control the motors for moving the stages such that stage 42.1 pushes the stage 42.2 gently during the joint scan movement. Herewith, a control system (using a feedback and/or a feedforward loop) of the positioning system is fed with position measurements (actually the term position measurement may include position, velocity, acceleration and/or jerk measurements) of the stages and calculates setpoint-signals for the relevant motors. Next, motors are controlled by the positioning system according to the setpoint-signals such that the mutual constant distance D between the planes of the respective immersion cross edges is essentially zero, or a certain value close to zero.

According to an embodiment of the lithographic apparatus, the positioning system is constructed and arranged to control the motors for moving the stages such that during the joint scan movement the mutual distance D is larger than zero but smaller than 1 millimeter. A favorable mutual distance D appears to be between 0.05 and 0.2 millimeter. A distance D in this distance-range is especially favorable if one of the stages is provided with a channel system leading to and from an opening of the immersion cross edge, wherein the channel system is constructed and arranged to generate a flow of gas and/or liquid along the immersion cross edge during the joint scan movement. The generation of this flow reduces the chance that bubbles (bubbles deteriorate the projection of patterns on the substrate) are generated in the immersion liquid 66. A stable and well controlled distance D results in a stable and well favorable flow thereby avoiding the generation of bubbles in the immersion liquid during the joint scan movement.

For the position measurement of the first stage and the second stage an interferometer position measurement system may be used which is configured to continuously measure the position of the first and second stage during the joint scan movement.

The interferometer system may for instance use interferometer-mirrors attached to the stages for position measuring, or in another embodiment the stages may have reflecting surfaces.

Figure 4:
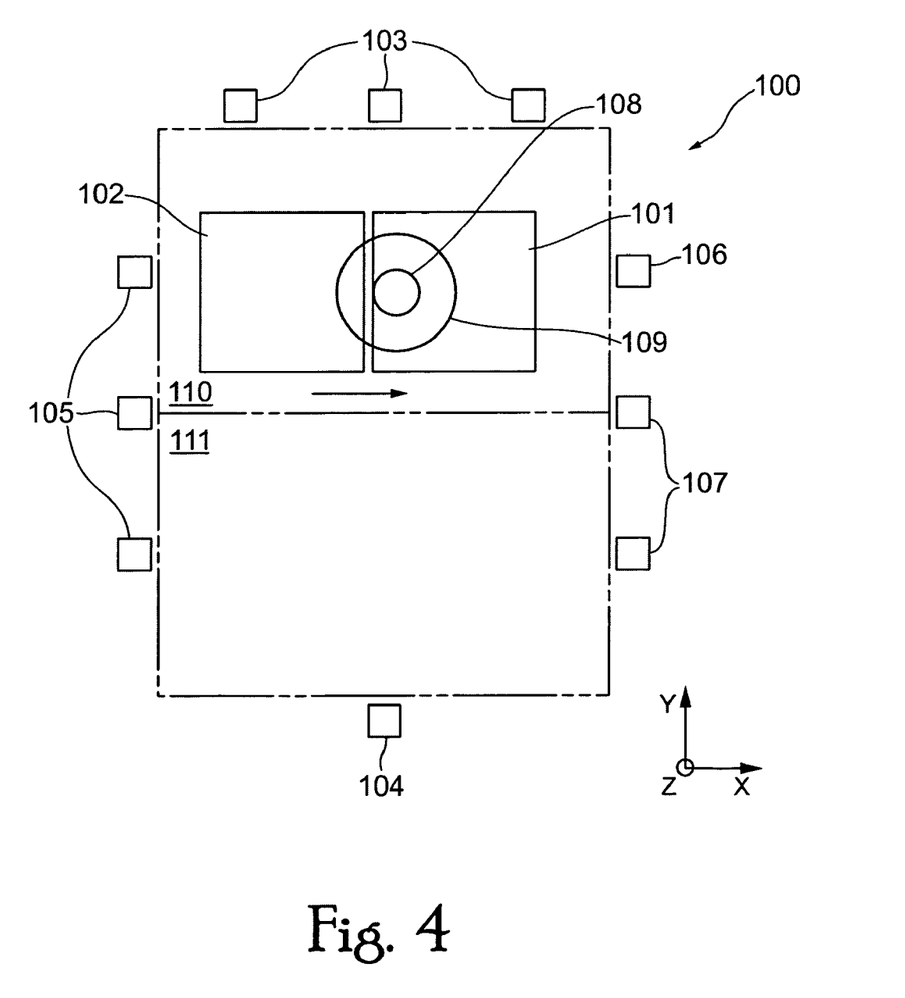
FIG. 4 depicts an interferometer position measurement system according to an embodiment the invention.

In FIG. 4, an interferometer position measurement system according to an embodiment of the invention is shown in general indicated with the reference number 100. The interferometer position measurement system 100 is designed to continuously measure the position of a first substrate stage 101 and a second substrate stage 102 in the whole process area (shown in dashed lines), i.e. the exposure area 110 in which the exposure station is located and in the exchange/ metrology area 111, in which an exchange of a substrate is performed.

The position measurement system includes three y-Rx-Rz interferometers 103 being arranged on a line at one side of the process area and a fourth y-Rx-Rz interferometer 104 being arranged at the opposite side of the process area. This fourth y-Rx-Rz interferometer 104 is arranged in the y-direction on substantially the same line as the middle interferometer of the three y-Rx-Ry interferometers 103. This line also intersects the axis of the projection system 109. Furthermore at the left side of the process area, three x-Ry-z interferometers 105 are arranged. At the opposite side (right side in FIG. 4), a fourth x-Ry-z interferometer 106 is arranged. This fourth x-Ry-z interferometer 106 is arranged in the x-direction on substantially the same line as the interferometer of the three x-Ry-z interferometers 105 arranged closest to the interferometers 103. Also this line intersects with the axis of the projection system 109.

The y-Rx-Rz interferometers 103, 104 and the x-Ry-z interferometers 105, 106 are multi-axis interferometers which have three or more interferometer beams. With such multi-axis interferometers, the position of a substrate stage 101, 102 can be determined in three degrees of freedom. Thus, y-Rx-Rz interferometers 103, 104 can each determine the position of the first stage or the second stage in the y-direction, Rx (rotation about x-axis) and Rz (rotation about y-axis) and the x-Ry-z interferometers 105, 106 can each determine the position of the first stage 101 or the second stage 102 in the x-direction, in Ry (rotation about y-axis) and in the z-direction (perpendicular to the plane of the drawing of FIG. 4). Such multi-axis interferometers are known for the man skilled in the art.

Next to the above interferometers, the position measurement system 100 includes two z-interferometers 107 located at the same side of the process area as the x-Ry-Rz interferometer 106 and in the x-direction opposite the two x-Ry-z interferometers 105 at the exchange area 111 side of the process area.

With the above described position measurement system 100, a continuous high accuracy control in six degrees of freedom is possible. With "continuous" in this respect is meant that during the whole lithographic process in every desired position of each of the two substrate stages, including expose, metrology and exchange of a substrate, a position measurement in six degrees of freedom of each substrate stage 101, 102 is possible. In this continuous measurement it is possible that a switch has to be made between different interferometers. For instance, when a substrate stage 101, 102 has to be moved from the exposure area 110 to the metrology/exchange area 111 (thus to be moved in the y-direction), the x-position may first be measured by the x-Ry-z interferometer 105 located next to the exposure area 110, then by the x-Ry-z interferometer 105 at the crossing line of the exposure area 110 and the metrology/ exchange area 111, and consequently by the x-Ry-z interferometer 105 next to the metrology/exchange area 111. In particular the set interferometers 105, 107 located at the opposite sides of the crossing line of the exposure area 110 and the metrology/exchange area 111, makes continuous position measurement in the y-direction possible. Furthermore, to make continuous control possible, the distance between two successive interferometers for measuring a position in a direction should not be larger than the dimension of the substrate stage in that direction, or at least the dimension of the reflective area in that direction. Otherwise a switch between successive interferometers under continuous measurement is not possible.

As discussed in relation to FIGS. 2 and 3, an embodiment of the present invention relates to a lithographic apparatus having a liquid confinement system. In FIG. 4, the liquid confined by this system is indicated with reference sign 108. In a preferred embodiment an immersion head take-over is performed, therewith making the use of a separate closing disc unnecessary. In an embodiment, such immersion head take-over requires the joint scan movement of the first substrate stage 101 and the second substrate stage 102. With such joint scan movement, it is desirable to have a high accuracy control of the first and second substrate stage 101, 102, and thus high accuracy position measurement of the first and second substrate stage 101, 102 during the immersion head take-over.

The interferometer position measurement system 100 as shown in FIG. 4 makes the high accuracy position measurement in six degrees of freedom possible for a joint scan movement in the x-direction. For this reason, the position measurement system 100 includes arranged at the side of the expose area three y-Rx-Rz interferometers 103.

In FIG. 4, the substrate stages 101, 102 are shown just before the immersion head take-over. The confined liquid is located at the edge of the first substrate stage 101. The y-position of the first substrate stage 101 is measured by the (in the drawing) middle y-Rx-Rz interferometer 103, and the y-position of the second substrate stage 102 is measured by the left y-Rx-Rz interferometer 103. The x-position of the first substrate stage 101 is measured by the x-Ry-z interferometer 106 and the x-position of the second substrate stage is measured by the (in the drawing) top x-Ry-z interferometer 105.

When the first 101 and the second substrate stage 102 are moved in the x-direction as indicated by the arrow, the second substrate stage 102 will be moved under the confined liquid 108. During this movement the y-position measurement of the first substrate stage 101 will be taken over by the right y-Rx-Rz interferometer 103 and the y-position measurement of the second substrate stage will be taken over by the middle y-Rx-Rz interferometer 103.

After the joint scan movement a substrate on the second substrate stage 102 may be exposed to a pattern projected by the projection system 109. The first substrate stage 101 may be moved under continuous control to the exchange area to exchange the exposed substrate supported on the first substrate stage 1 for a new one.

In an alternative embodiment of the position measurement system, the y-Rx-Rz interferometer 104 may take over the function of the middle y-Rx-Rz interferometer 103. However, such embodiment is less preferred as the relative long beam length may result in larger measurement errors.

In another alternative embodiment, the middle y-Rx-Rz interferometer 103 may be omitted, and the other two y-Rx-Rz interferometers 103 are arranged closer to each other at a distance maximally the dimension of each of the substrate stages 101 and 102. Such embodiment requires one interferometer less, but is however less preferred as such embodiment requires switching between the two y-Rx-Rz interferometers 103 during the projection of a pattern on the substrate supported on the respective substrate stage 101, 102.

As the first substrate stage 101 and second substrate stage 102 only eclipse each other in the x-direction during the joint scan movement, as this is the only moment that the first 101 and second substrate stage 102 are located next to each other in the x-direction, only the interferometers 105, 106 at this level, i.e. the line in x-direction through the axis of the projection system, have to be of the same x-Ry-z type. The other interferometers 107 at the right side of the process area may for this reason be single axis z-type interferometers.

With the embodiment of FIG. 4, it may not be possible to perform a continuous position measurement of the first and second substrate stage during a joint scan movement in the y-direction. The reason for this is that during such scan movement one of the substrate stages 101, 102 will be moved towards the interferometers 103 until it will be fully positioned between the confined liquid 108 and the interferometers 108. Even if there would be provided space for such positioning of one of the substrates stages 101, 102, the x, Ry and z position of this substrate stage cannot be measured as the respective substrate stage is outside of the range of each of the x-Ry-z interferometer 105, 106, and the z-interferometers 107.

Figure 5:
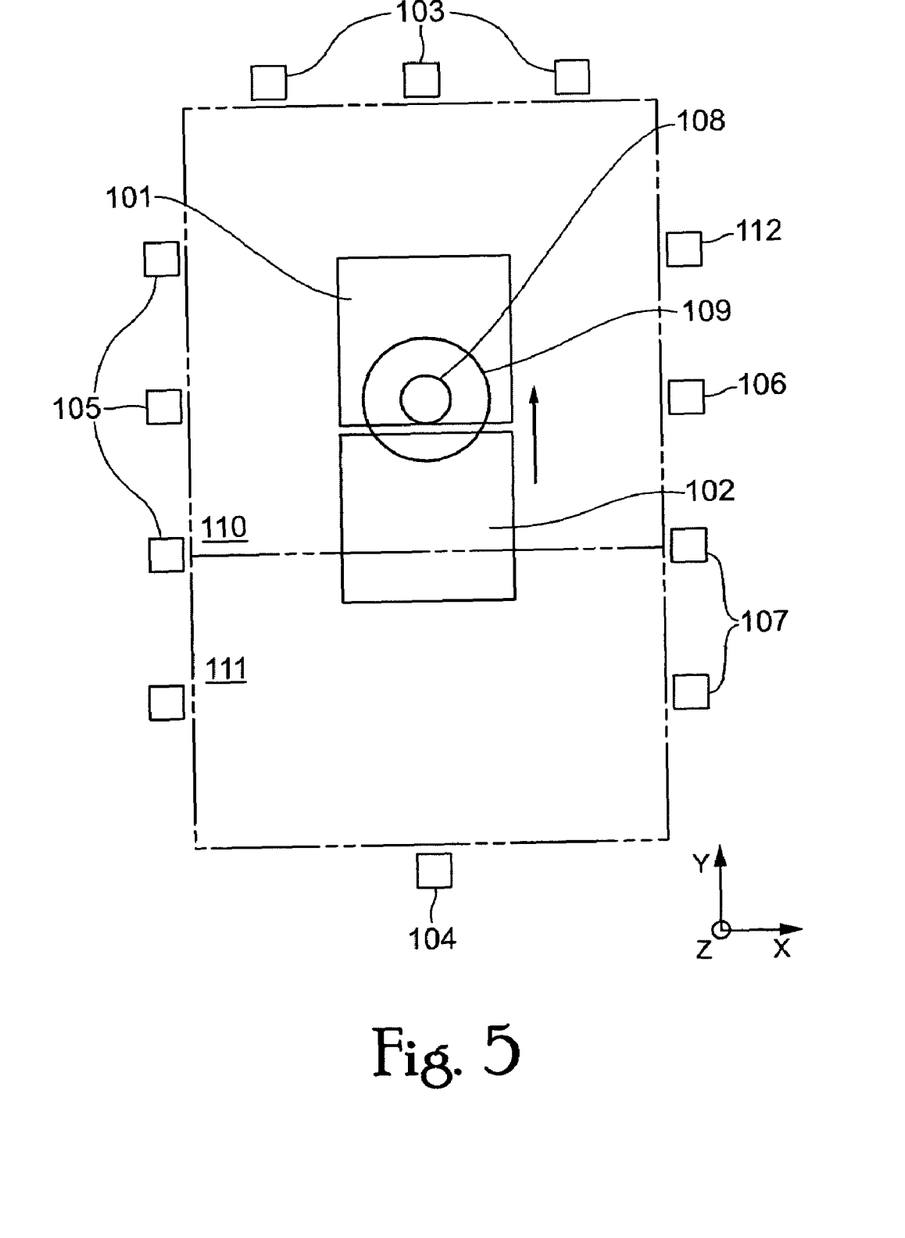
FIG. 5 depicts an interferometer position measurement system according to an embodiment of the invention.

In the embodiment of FIG. 5, continuous position measurement is obtained by the provision of an extra set of an x-Ry-z interferometer 105 and a z-interferometer 112 on a line between the confined liquid 108 and the interferometers 103. The position measurement system shown in FIG. 5 further includes all interferometers 103, 104, 105, 106 and 107 of the embodiment of FIG. 4. Thereby, since the crossing of the substrate stages 101 and 102 can take place at the line of the interferometers 105 and 106 arranged on the line in x-direction intersecting the axis of the projection system 109, there is no need to provide two extra x-Ry-z interferometers on opposite sides of the process area, but one will suffice.

In FIG. 5, the substrate stages 101 and 102 are also shown just before the joint scan movement of the immersion head take over, whereby the confined liquid 108 is fully located above the first substrate stage 101. The y-position of the first substrate stage 101 is measured by the middle y-Rx-Rz interferometer 103, and the y-position of the second substrate stage 102 is measured by the y-Rx-Rz interferometer 104. The x-position of the first substrate stage 101 is measured by the x-Ry-z interferometer 105 at the level of the projection system 109 (or the x-Ry-z interferometer 106), while the x-position of the second substrate stage is measured by the x-Ry-z interferometer 105 arranged at the crossing of the expose area 110 and the metrology/exchange area 111.

When the first substrate stage 101 and the second substrate stage 102 are moved in the y-direction as indicated by the arrow, the second substrate stage 102 will be moved under the confined liquid 108. During this movement the x-position measurement of the first substrate stage 101 will be taken over by the newly provided top x-Ry-z interferometer 105 and the x-position measurement of the second substrate stage will be taken over by the x-Ry-z interferometer 105 at the level of the projection system 109 (or the x-Ry-z interferometer 106). Thus with the provision of the new interferometers 105, 112 a continuous position measurement of the first and second substrate stage 101, 102 during a joint scan movement in the y-direction for an immersion head take-over is possible.

It is remarked that when the joint scan movement for immersion head take-over is performed in the y-direction, the crossing of the two substrate stages in x-direction does not have to take place at the level of the projection system 109. Therefore the crossing may be performed at another level in y-direction, whereby it is required that at that level the second x-Ry-z interferometer 106 is arranged at the opposed side of the process area.

The interferometer position measurement systems of FIGS. 4 and 5 are configured to measure the position of the first and the second substrate stage 101 and 102 in six degrees of freedom. In the case less degrees of freedom have to be measured with the position measurement system, the interferometers may be of different type, for instance single axis instead of multi axis type interferometers, and some interferometers may be omitted. For instance when only the x and y position of the first and second substrate stage 101, 102 have to be measured, the interferometers 103 and 104 may be single axis y-interferometers, the interferometers 105 and 106 may be single axis x-interferometers and the z-interferometers 107 may be omitted.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a patterning device support constructed to support a patterning device, the patterning device being capable of imparting a radiation beam with a pattern in its cross-section to form a patterned radiation beam;
    a projection system configured to project the patterned radiation beam onto a substrate in an exposure station of the apparatus;
    a liquid confinement system configured to confine liquid in a space between a final element of the projection system and the substrate;
    a first and a second substrate stage constructed to hold substrates; and
    an interferometer position measurement system configured to measure a position of the first and second substrate stages,
    wherein the first and second substrate stages are constructed and arranged to mutually cooperate in order to perform a joint movement to bring the lithographic apparatus from a first configuration, in which the liquid would be confined between a first substrate held by the first substrate stage and the final element, towards a second configuration, in which the liquid would be confined between a second substrate held by the second substrate stage and the final element, such that during the joint movement the liquid is essentially confined within the space with respect to the final element, and
    wherein the interferometer position measurement system is configured to continuously measure the position of the first substrate stage and the second substrate stage.

2. The lithographic apparatus of claim 1, wherein the position measurement system is configured to measure the position of the first substrate stage and the second substrate stage in six degrees of freedom.

3. The lithographic apparatus of claim 1, wherein the first and second substrate stages have substantially the same dimensions.

4. The lithographic apparatus of claim 1, wherein the interferometer position measurement system comprises two interferometers that are arranged at opposite sides of a process area and along a direction that substantially crosses an axis of the projection system, the direction extending in the direction of the joint movement.

5. The lithographic apparatus of claim 1, wherein the interferometer position measurement system comprises:
    two x-interferometers to measure the position of the first and/or second substrate stages in a first direction, the first direction being substantially perpendicular to an axis of the projection system, the two x-interferometers arranged at opposite sides of a process area and along a direction that extends in the first direction and that substantially crosses the axis of the projection system; and
    two y-interferometers to measure the position of the first and/or second substrate stages in a second direction, the second direction being substantially perpendicular to the first direction and substantially perpendicular to the axis of the projection system, the two y-interferometers arranged at opposite sides of a process area and along a direction that extends in the second direction and that substantially crosses the axis of the projection system.

6. The lithographic apparatus of claim 5, wherein the two x-interferometers and the two y-interferometers are multi-axis interferometers that are capable to measure more than one degree of freedom.

7. The lithographic apparatus of claim 6, wherein the two x-interferometers and the two y-interferometers include two x-Ry-z or x-Ry-Rz interferometers and two y-Rx-z-interferometers or y-Rx-Rz-interferometers.

8. The lithographic apparatus of claim 1, wherein the interferometer position measurement system comprises an interferometer that is substantially arranged at an intersection of an exposure area where an exposure station that includes the projection system is arranged and a exchange area where a substrate is exchanged, to measure the position of the first and/or second substrate stage at substantially the intersection.

9. The lithographic apparatus of claim 1, wherein the interferometer position measurement system comprises three interferometers that are arranged at one side of a process area and along a direction that is substantially parallel to the direction of the joint movement, a distance between two successive interferometers of the three interferometers being maximally a dimension of the first and/or second substrate stages in the direction.

10. The lithographic apparatus of claim 9, wherein a middle interferometer of the three interferometers is arranged so that a beam of the interferometer is directed along a direction of an axis of the projection system and substantially perpendicular to the direction of the joint movement.

11. The lithographic apparatus of claim 1, wherein the interferometer position measurement system comprises two interferometers that are arranged along a direction that is substantially parallel to the direction of the joint movement, a distance between the two interferometers being maximally a dimension of the first and/or second substrate stages in the direction.

12. A device manufacturing method comprising:
    projecting a patterned beam of radiation onto a substrate in a dual stage lithographic apparatus comprising first and second substrate stages that are each configured to hold a substrate and a liquid confinement system configured to confine liquid in a space between a final element of a projection system and the substrate;
    performing a joint movement of the first and second substrate stages to bring the lithographic apparatus from a first configuration, in which the liquid is confined between a first substrate held by the first substrate stage and the final element, towards a second configuration, in which the liquid is confined between a second substrate held by the second substrate stage and the final element;
    during the joint movement, substantially confining the liquid within the space with respect to the final element; and
    continuously measuring a position of the first substrate stage and the second substrate stage.

13. The method of claim 12, wherein measuring includes measuring the position of the first substrate stage and the second substrate stage in six degrees of freedom.

* * * * *